United States Patent
Yeh et al.

(10) Patent No.: US 9,147,668 B2
(45) Date of Patent: Sep. 29, 2015

(54) METHOD FOR FABRICATING SEMICONDUCTOR STRUCTURE

(71) Applicant: Siliconware Precision Industries Co., Ltd., Taichung (TW)

(72) Inventors: Chi-Tung Yeh, Taichung (TW); Chun-Tang Lin, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 0 days.

(21) Appl. No.: 14/074,165

(22) Filed: Nov. 7, 2013

(65) Prior Publication Data
US 2015/0064850 A1    Mar. 5, 2015

(30) Foreign Application Priority Data
Sep. 4, 2013  (TW) .............................. 102131767 A

(51) Int. Cl.
*H01L 23/00*         (2006.01)

(52) U.S. Cl.
CPC ................ *H01L 24/82* (2013.01); *H01L 24/01* (2013.01); *H01L 24/02* (2013.01); *H01L 24/91* (2013.01); *H01L 24/94* (2013.01); *H01L 24/95* (2013.01); *H01L 24/97* (2013.01); *H01L 24/98* (2013.01); *H01L 2224/03002* (2013.01); *H01L 2224/94* (2013.01); *H01L 2224/95* (2013.01); *H01L 2224/95001* (2013.01); *H01L 2224/97* (2013.01)

(58) Field of Classification Search
CPC ......... H01L 24/01; H01L 24/02; H01L 24/82; H01L 24/91; H01L 24/94; H01L 24/95; H01L 24/97; H01L 24/98; H01L 2224/03001; H01L 2224/03002; H01L 2224/94; H01L 2224/95; H01L 2224/95001
USPC ................... 438/108, 110, 113, 114, 118, 667
See application file for complete search history.

(56) References Cited

U.S. PATENT DOCUMENTS

| | | | |
|---|---|---|---|
| 2012/0070939 A1* | 3/2012 | Dunne et al. | 438/110 |
| 2014/0103499 A1* | 4/2014 | Andry et al. | 257/644 |

* cited by examiner

*Primary Examiner* — Thanhha Pham
(74) *Attorney, Agent, or Firm* — Mintz Levin Cohn Ferris Glovsky and Popeo, P.C.; Peter F. Corless; Steven M. Jensen

(57) ABSTRACT

A method for fabricating a semiconductor structure is disclosed. First, an interposer is disposed on a carrier. The carrier has a base body and a bonding layer bonded to the base body. The interposer has opposite first and second sides and the first side has a plurality of conductive elements. The interposer is disposed on the carrier with the first side bonded to the bonding layer and the conductive elements embedded in the bonding layer. Then, at least a semiconductor element is disposed on the second side of the interposer. As such, the semiconductor element and the interposer form a semiconductor structure. Since the conductive elements are embedded in the bonding layer instead of the base body, the present invention eliminates the need to form concave portions in the base body for receiving the conductive elements. Therefore, the method of the present invention is applicable to interposers of different specifications.

10 Claims, 3 Drawing Sheets

METHOD FOR FABRICATING SEMICONDUCTOR STRUCTURE

CROSS-REFERENCES TO RELATED APPLICATIONS

This application claims under 35 U.S.C. §119(a) the benefit of Taiwanese Application No. 102131767, filed Sep. 4, 2013, the entire contents of which is incorporated herein by reference.

BACKGROUND OF THE INVENTION

1. Field of the Invention

The present invention relates to semiconductor structures, and more particularly, to a method for fabricating a semiconductor structure having an interposer.

2. Description of Related Art

Flip-chip technologies facilitate to reduce chip packaging sizes and shorten signal transmission paths and therefore have been widely used for chip packaging. Various types of packages such as chip scale packages (CSPs), direct chip attached (DCA) packages and multi-chip module (MCM) packages can be achieved through flip-chip technologies.

In a flip-chip packaging process, a big CTE (Coefficient of Thermal Expansion) mismatch between a chip and a packaging substrate adversely affects the formation of joints between conductive bumps of the chip and contacts of the packaging substrate, thus easily resulting in delamination of the conductive bumps from the packaging substrate. On the other hand, along with increased integration of integrated circuits, a CIE mismatch between a chip and a packaging substrate induces more thermal stresses and leads to more serious warpage, thereby reducing the product reliability and resulting in failure of a reliability test.

Accordingly, an interposer made of a semiconductor material close to a semiconductor chip has been developed to overcome the above-described drawbacks caused by a CTE mismatch.

FIG. 1A shows a conventional semiconductor package having a through silicon interposer. Referring to FIG. 1A, the semiconductor package has a packaging substrate 9 having a plurality of bonding pads 90 having a large pitch, a semiconductor chip 3 having a plurality of electrode pads 30 having a small pitch, and a through silicon interposer (TSI) 2 disposed between the packaging substrate 9 and the semiconductor chip 3. The through silicon interposer 2 has a substrate unit 20, a plurality of through silicon vias (TSVs) 21 formed in the substrate unit 20 and a redistribution layer (RDL) structure 22 formed on a lower side of the substrate unit 20. The RDL structure 22 of the through silicon interposer 2 is electrically connected to the bonding pads 90 of the packaging substrate 9 through a plurality of conductive elements 23, and the electrode pads 30 of the semiconductor chip 3 are electrically connected to the TSVs 21 through a plurality of solder bumps 31. Further, an underfill 32 is formed between the semiconductor chip 3 and the through silicon interposer 2 to encapsulate the solder bumps 31. In an alternative embodiment, referring to FIG. 1B, an RDL structure 22' is formed on an upper side of the through silicon interposer 2 on which the semiconductor chip 3 is to be disposed.

The use of the through silicon interposer 2 facilitates to overcome the above-described drawbacks and also reduces the size of the semiconductor package. For example, a flip-chip packaging substrate generally has a minimum line width and pitch of 12 um. When the number of the electrode pads of a semiconductor chip increases, since the line width and pitch of the flip-chip packaging substrate cannot be reduced, the area of the flip-chip packaging substrate must be increased to increase the wiring density so as to accommodate the semiconductor chip having high I/O counts. On the other hand, referring to FIG. 1A, the through silicon interposer 2 can have a minimum line width and pitch of 3 um. Therefore, the semiconductor chip 3 having high I/O counts can be disposed on the through silicon interposer 2 without increasing the area of the packaging substrate 9. As such, the semiconductor chip 3 is electrically connected to the packaging substrate 9 through the through silicon interposer 2.

Further, the through silicon interposer 2 has characteristics of fine pitch and fine line width and therefore facilitates to shorten the electrical transmission path. Therefore, compared with a semiconductor chip directly disposed on a packaging substrate, the semiconductor chip 3 disposed on the through silicon interposer 2 achieves a higher electrical transmission speed.

To fabricate the above-described semiconductor package having the through silicon interposer 2, the through silicon interposer 2 is first bonded to the semiconductor chip 3 to form a semiconductor structure 1 and then the semiconductor structure 1 is disposed on the packaging substrate 9. However, the through silicon interposer 2 is generally comprised of a plurality of substrate units 20. After a plurality of semiconductor chips 3 are bonded to the substrate units 20 of the interposer 2, the overall structure needs to be singulated to obtain a plurality of semiconductor structures 1. Therefore, warpage easily occurs to the through silicon interposer 2 when the semiconductor chips 3 are bonded to the substrate units 20, thereby adversely affecting the electrical connection between the semiconductor chips 3 and the through silicon interposer 2.

Accordingly, referring to FIG. 1B, a carrier 4 having a plurality of concave portions 400 for carrying the interposer has been proposed.

Referring to FIG. 1B, a plurality of concave portions 400 are formed on a surface of a silicon substrate 40 and then a bonding layer 41 made of an adhesive material is formed on the silicon substrate 40 by spin coating. In the present embodiment, the bonding layer 41 is only formed on the surface of the silicon substrate 40. In another embodiment, the bonding layer 41 can be formed not only on the surface of the silicon substrate 40 but also in the concave portions 400 of the silicon substrate 40. Then, the through silicon interposer 2 is attached to the bonding layer 41 with the conductive elements 23 received in the concave portions 400. As such, when the semiconductor chips 3 are disposed on the substrate units 20 of the through silicon interposer 20, the bonding layer 41 facilitates to prevent warping of the through silicon interposer 2 and cracking of the semiconductor chips 3 and ensures a good electrical connection quality between the solder bumps 31 and the through silicon interposer 2.

However, in the above-described method for forming the semiconductor structure 1, different silicon substrates 40 are required according to silicon interposers 2 of different specifications (for example, different numbers and pitches of the conductive elements 23) so as to provide different sizes and numbers of concave portions 400, thus increasing the fabrication cost of the semiconductor package.

Further, the method needs an expensive photoresist material to form the concave portions 400 in the silicon substrate 40. As such, to fabricate different silicon substrates 40, a large amount of the photoresist material is used, thereby greatly increasing the fabrication cost.

Therefore, there is a need to provide a method for fabricating a semiconductor structure so as to overcome the above-described drawbacks.

SUMMARY OF THE INVENTION

In view of the above-described drawbacks, the present invention provides a method for fabricating a semiconductor structure, which comprises the steps of: disposing an interposer on a carrier, wherein the carrier has a base body and a bonding layer bonded to the base body and the interposer has a first side with a plurality of conductive elements and a second side opposite to the first side such that the interposer is disposed on the carrier with the first side bonded to the bonding layer and the conductive elements embedded in the bonding layer; and disposing at least a semiconductor element on the second side of the interposer, wherein the semiconductor element and the interposer form a semiconductor structure.

In the above-described method, the interposer can be a silicon-containing substrate. The interposer can have a plurality of conductive through holes penetrating the first and second sides and electrically connected to the conductive elements. Further, the interposer can have an RDL structure formed on the first side or the second side and electrically connected to the conductive through holes and the conductive elements.

In the above-described method, the conductive elements can be made of a solder-containing material.

In the above-described method, the carrier can further have a release layer formed between the base body and the bonding layer. By removing the release layer, the semiconductor structure and the bonding layer on the semiconductor structure can be separated from the base body.

In an embodiment, the interposer has a plurality of substrate units such that before removing the release layer, the method further comprises performing a singulation process to the interposer, and after removing the release layer, the method further comprises removing the bonding layer so as to obtain a plurality of semiconductor structures.

In an embodiment, after removing the release layer, the method further comprises removing the bonding layer to expose the conductive elements.

In an embodiment, removing the release layer comprises removing the release layer corresponding in position to the interposer and then cutting the bonding layer so as to separate the semiconductor structure and the bonding layer on the semiconductor structure from the base body.

The release layer can be removed by laser ablation. In an embodiment, laser light penetrates through the base body to remove the release layer. In an embodiment, laser light removes the release layer corresponding in position to the interposer.

The method can further comprise removing the bonding layer to separate the base body and the semiconductor structure.

Since the conductive elements of the interposer are embedded in the bonding layer of the carrier instead of the base body of the carrier, the present invention eliminates the need to form concave portions in the base body as required in the prior art. As such, the method of the present invention is applicable to interposers of different specifications. Further, the present invention dispenses with the photoresist material that is required in the prior art for forming concave portions in a base body. Therefore, the present invention greatly reduces the material cost and fabrication time.

DETAILED DESCRIPTION OF PREFERRED EMBODIMENTS

The following illustrative embodiments are provided to illustrate the disclosure of the present invention, these and other advantages and effects can be apparent to those in the art after reading this specification.

It should be noted that all the drawings are not intended to limit the present invention. Various modifications and variations can be made without departing from the spirit of the present invention. Further, terms such as "upper", "lower", "first", "second", "on", "a" etc. are merely for illustrative purposes and should not be construed to limit the scope of the present invention.

FIGS. 2A to 2F are schematic cross-sectional views showing a method for fabricating a semiconductor structure 7 according to the present invention.

Figure 1A:
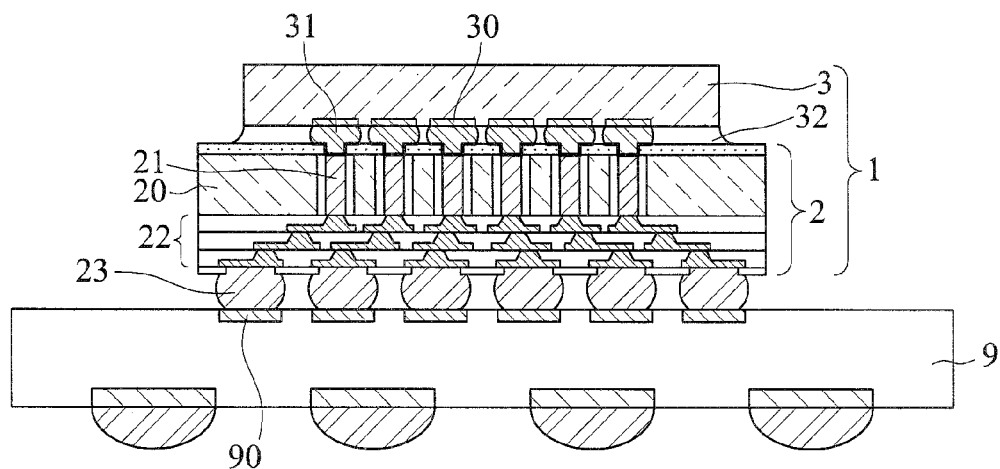
FIG. 1A is a schematic cross-sectional view of a conventional semiconductor package.
Figure 1B:
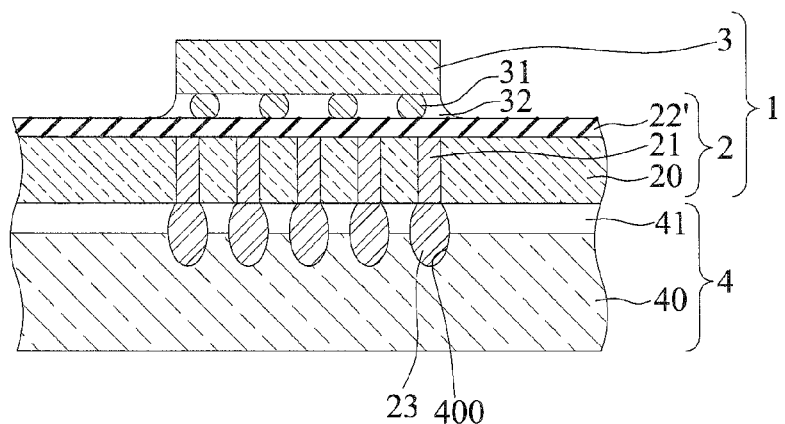
FIG. 1B is a schematic cross-sectional view showing a method for fabricating a semiconductor structure according to the prior art.
Figure 2A:
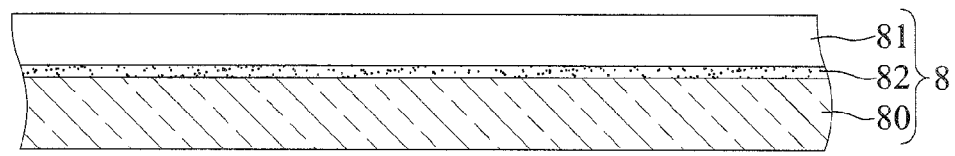
FIGS. 2A to 2F are schematic cross-sectional views showing a method for fabricating a semiconductor structure according to the present invention.

Referring to FIG. 2A, a carrier 8 having a base body 80, a release layer 82 formed on the base body 80 and a bonding layer 81 formed on the release layer 82 is provided.

In the present embodiment, the base body is a transparent board such as glass and the bonding layer 81 is made of an adhesive material.

The release layer 82 is a carbonized layer and formed through sputtering and does not have an adhesive property.

Figure 2B:
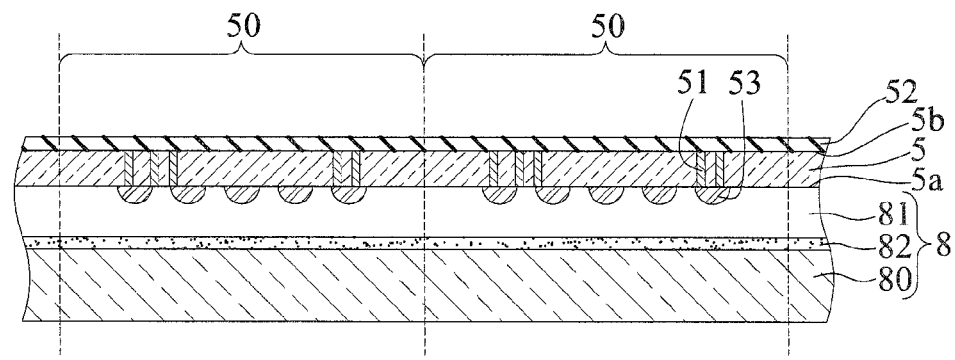

Referring to FIG. 2B, an interposer 5 is disposed on the bonding layer 81. The interposer 5 has a first side 5a with a plurality of conductive elements 53 and a second side 5b opposite to the first side 5a. The first side 5a of the interposer 5 is bonded to the bonding layer 81 and the conductive elements 53 are embedded in the bonding layer 81.

In the present embodiment, the interposer 5 is a silicon-containing substrate and has a plurality of substrate units 50. In particular, the interposer 5 has a plurality of conductive through holes 51 penetrating the first and second sides 5a, 5b and electrically connected to the conductive elements 53. An RDL structure 52 is formed on the first side 5a or the second side 5b of the interposer 5 according to the practical need. The RDL structure 52 is electrically connected to the conductive through holes 51 and the conductive elements 53.

The conductive elements 53 are made of a solder-containing material. The conductive elements 53 can be, but not limited to, metal bumps, metal posts, pin-shaped bodies and ball-shaped bodies.

Figure 2C:
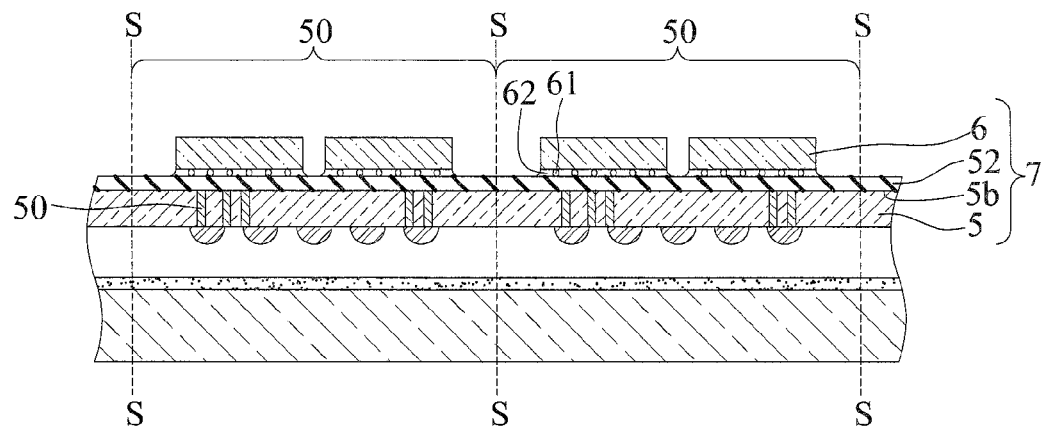

Referring to FIG. 2C, a plurality of semiconductor elements 6 are disposed on the second side 5b of the interposer 5. As such, the semiconductor elements 6 and the interposer 5 form a semiconductor structure 7.

In the present embodiment, the semiconductor elements 6 are semiconductor chips, which are disposed on the substrate units 50 and electrically connected to the RDL structure 52 and the conductive through holes 51 through a plurality of solder bumps 61.

Further, through a liquid encapsulation process, an underfill 62 is formed on the second side 5b of the interposer 5 for encapsulating the solder bumps 61.

Figure 2D:
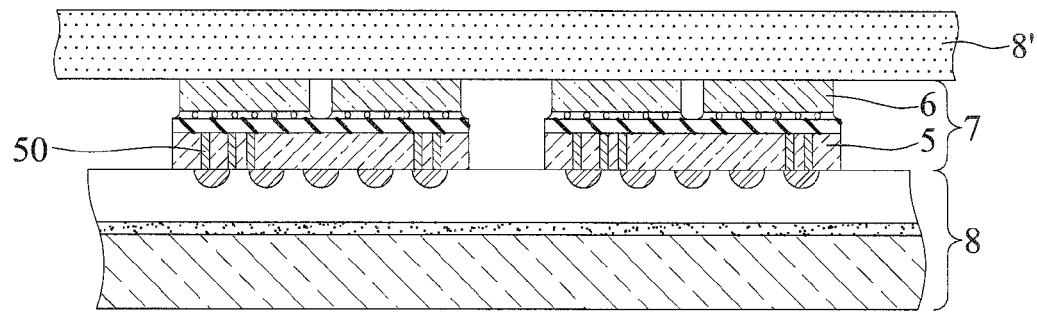

Referring to FIG. 2D, a singulation process is performed along a cutting path S of FIG. 2C to form a plurality of semiconductor structures 7. Then, a support member 8' is disposed on the semiconductor elements 6 of the semiconductor structures 7.

In the present embodiment, the support member 8' is made of an adhesive material attached to the semiconductor elements 6.

Figure 2E:
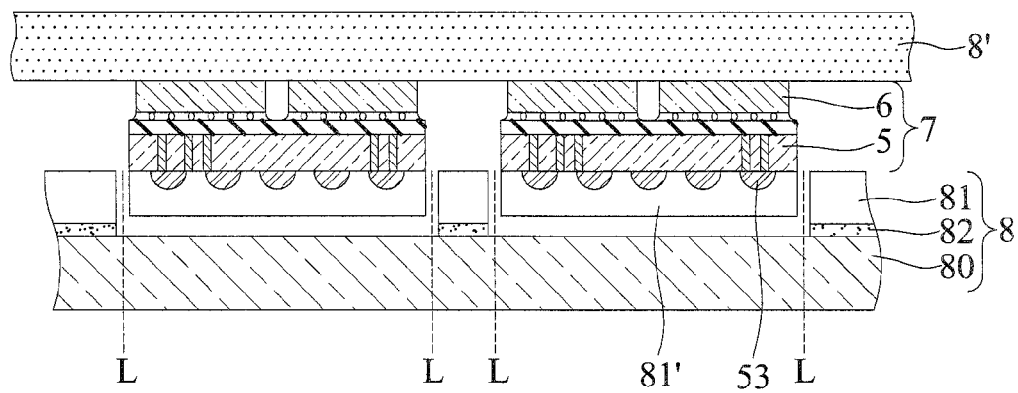

Referring to FIG. 2E, the release layer 82 is removed to separate the semiconductor structures 7 along with the bonding layer 81' and the support member 8' on the semiconductor structures 7 from the base body 80.

In the present embodiment, the release layer 82 is removed by laser ablation. In particular, laser light penetrates through the base body 80 to remove the release layer 82. Preferably, only the release layer 82 corresponding in position to the interposer 5 is removed by laser light. Then, the bonding layer 81 is cut along a cutting path L.

Further, if no release layer is formed on the carrier 8, the bonding layer 81 can be removed by a solvent so as to separate the base body 80 from the semiconductor structures 7. However, since the solvent cannot completely permeate into the center of the bonding layer 81, the base body 80 cannot be completely separated from the semiconductor structure 7. Therefore, the release layer 82 is preferably formed between the bonding layer 81 and the base body 80. As such, the release layer 81 is removed by laser ablation to separate the base body 80 from the bonding layer 81, and then the bonding layer 81' is removed from the semiconductor structures 7.

Figure 2F:
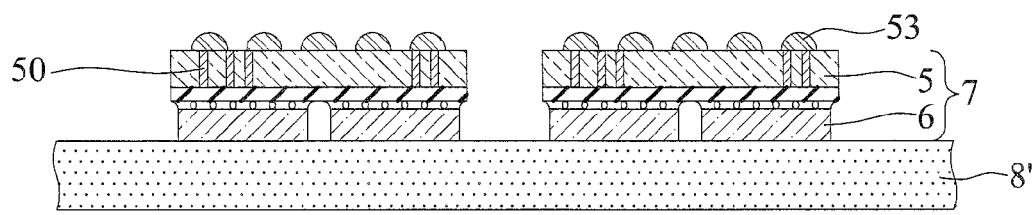

Referring to FIG. 2F, the bonding layer 81' is removed by a solvent to expose the conductive elements 53. Subsequently, the semiconductor structures 7 can be separated from the support member 8' and disposed on packaging substrates (not shown) to form semiconductor packages.

Since the conductive elements 53 of the interposer 5 are embedded in the bonding layer 81, the present invention only needs to form the bonding layer 81 on the base body 80 instead of forming concave portions in the base body 80. Therefore, the method of the present invention is applicable to the interposer 5 of different specifications. Further, the present invention dispenses with the photoresist material that is required in the prior art for forming concave portions in the base body 80. Therefore, the present invention greatly reduces the material cost and fabrication time.

Furthermore, through the design of the release layer 82, the present invention ensures an effective separation of the base body 80 from the semiconductor structures 7 by removing the release layer 82 to separate the base body 80 and the bonding layer 81 first and then removing the bonding layer 81'.

The above-described descriptions of the detailed embodiments are only to illustrate the preferred implementation according to the present invention, and it is not to limit the scope of the present invention. Accordingly, all modifications and variations completed by those with ordinary skill in the art should fall within the scope of present invention defined by the appended claims.

What is claimed is:

1. A method for fabricating a semiconductor structure, comprising the steps of:

disposing an interposer on a carrier, wherein the carrier has a base body, a release layer, and a bonding layer bonded to the base body, the interposer has a first side with a plurality of conductive elements and a second side opposite to the first side such that the interposer is disposed on the carrier with the first side bonded to the bonding layer and the conductive elements embedded in the bonding layer, and the release layer is formed between the base body and the bonding layer;

disposing a plurality of semiconductor elements on the second side of the interposer, wherein the semiconductor element and the interposer form a semiconductor structure, and the interposer has a plurality of substrate units;

performing a singulation process to the interposer;

after performing the singulation process, removing the release layer to separate the semiconductor structure and the bonding layer on the semiconductor structure from the base body; and after removing the release layer, removing the bonding layer.

2. The method of claim 1, wherein the interposer is a silicon-containing substrate.

3. The method of claim 1, wherein the interposer has a plurality of conductive through holes penetrating the first and second sides and electrically connected to the conductive elements.

4. The method of claim 3, wherein the interposer has an RDL structure formed on the first side or the second side and electrically connected to the conductive through holes and the conductive elements.

5. The method of claim 1, wherein the conductive elements are made of a solder-containing material.

6. The method of claim 1, wherein the step of removing the bonding layer is performed to expose the conductive elements.

7. The method of claim 1, wherein removing the release layer comprises removing the release layer corresponding in position to the interposer and then cutting the bonding layer so as to separate the semiconductor structure and the bonding layer on the semiconductor structure from the base body.

8. The method of claim 1, wherein the release layer is removed by laser ablation.

9. The method of claim 8, wherein laser light penetrates through the base body to remove the release layer.

10. The method of claim 8, wherein laser light removes the release layer corresponding in position to the interposer.

* * * * *